(12) United States Patent
Brandenburg et al.

(10) Patent No.: US 7,268,429 B2
(45) Date of Patent: Sep. 11, 2007

(54) TECHNIQUE FOR MANUFACTURING AN OVERMOLDED ELECTRONIC ASSEMBLY

(75) Inventors: Scott D. Brandenburg, Kokomo, IN (US); David A. Laudick, Kokomo, IN (US); Thomas A. Degenkolb, Noblesville, IN (US); Matthew R. Walsh, Sharpsville, IN (US); Jeenhuei S. Tsai, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 171 days.

(21) Appl. No.: 11/167,473

(22) Filed: Jun. 27, 2005

(65) Prior Publication Data

US 2006/0292751 A1    Dec. 28, 2006

(51) Int. Cl.
*H01L 23/34* (2006.01)
*H01L 21/44* (2006.01)

(52) U.S. Cl. .............. 257/712; 257/717; 257/720; 438/121; 438/122

(58) Field of Classification Search .............. 361/704, 361/707, 715, 728; 257/712, 717, 720; 438/106–108, 438/121, 122
See application file for complete search history.

(56) References Cited

U.S. PATENT DOCUMENTS

| 4,679,463 | A | 7/1987 | Ozaki et al. |
| 5,189,930 | A | 3/1993 | Kameda |
| 5,310,388 | A | 5/1994 | Okcuoglu et al. |
| 2004/0148214 | A1 | 7/2004 | Aziz et al. |
| 2004/0148299 | A1 | 7/2004 | Teegan et al. |
| 2006/0281230 | A1* | 12/2006 | Brandenburg et al. ...... 438/127 |

* cited by examiner

*Primary Examiner*—Hsien-Ming Lee
(74) *Attorney, Agent, or Firm*—Jimmy L. Funke

(57) ABSTRACT

A technique for manufacturing an electronic assembly uses a mold that has a first mold portion and a second mold portion. The first mold portion includes a plurality of spaced mold pins extending from an inner surface. A cavity of the first and second mold portions provides a mold cavity, when joined. A backplate is also provided that includes a plurality of support pedestals and an integrated heatsink extending from a first side of the backplate. A substrate includes a first side of an integrated circuit (IC) die mounted to a first side of the substrate. The backplate and the substrate are placed within the cavity of the second mold portion and the support pedestals are in contact with the first side of the substrate. The first and second mold portions are joined and the mold pins contact a second surface of the substrate during an overmolding process.

20 Claims, 5 Drawing Sheets

PRIOR ART

US 7,268,429 B2

TECHNIQUE FOR MANUFACTURING AN OVERMOLDED ELECTRONIC ASSEMBLY

TECHNICAL FIELD

The present invention is generally directed to an electronic assembly and, more specifically, to an overmolded electronic assembly.

BACKGROUND OF THE INVENTION

Today, overmolded electronic assemblies are manufactured by adhesively mounting a substrate, e.g., a printed circuit board (PCB) assembly to a backplate with a structural adhesive and attaching an integrated circuit (IC) die, e.g., a flip-chip, to a heatsink pedestal of the backplate with a thermally conductive adhesive. In general, a heat cycle, e.g., 150° C. for 20 minutes, is utilized to cure the adhesives prior to an overmolding process. The structural adhesive bonds areas of the PCB that are not populated to corresponding support pedestals on the backplate. As such, the bonded area between the PCB and the backplate is limited. Furthermore, the strength of most structural adhesives is marginal at common molding temperatures, e.g., 165° C. Due to the fact that the structural bond area is limited and the strength of the structural adhesive is marginal at overmolding temperatures, minor movements of the PCB may occur during the overmolding process. As the flip-chip is bonded to a heatsink, with a thermally conductive adhesive, movement of the PCB can lead to fractured flip-chip solder bumps.

FIG. 1 depicts an exemplary prior art backplate 10, including a structural adhesive 14 applied to a lip (i.e., a peripheral pedestal) 12 of the backplate 10. The structural adhesive 14 is also applied to a plurality of integral support pedestals 20, which support a PCB, when mounted to the backplate 10. As is shown, a thermally conductive adhesive 18 is applied to a plurality of integral heatsinks 16, which are utilized to heatsink IC dies, which are electrically coupled to the PCB (not shown in FIG. 1). It should be appreciated that both the adhesive dispense and adhesive cure steps require material and process time to implement.

What is needed is a technique for manufacturing an overmolded electronic assembly that does not require a structural adhesive to bond a substrate to a backplate. Furthermore, it would be desirable if the technique did not require a thermally conductive adhesive to thermally connect an integrated circuit (IC) die of the substrate to an integral heatsink of the backplate.

SUMMARY OF THE INVENTION

According to one embodiment of the present invention, a technique for manufacturing an electronic assembly includes a number of steps. Initially, a mold is provided that has a first mold portion and a second mold portion. The first and second mold portions each include a cavity. The first mold portion includes a plurality of spaced mold pins extending from an inner surface. The cavity of the first and second mold portions provides a mold cavity, when joined. A backplate is also provided that includes a plurality of support pedestals and an integrated heatsink extending from a first side of the backplate. A substrate is also provided with a first side of an integrated circuit (IC) die mounted to a first side of the substrate. The IC die is electrically connected to one or more of a plurality of electrically conductive traces formed on the first side of the substrate. The backplate and the substrate are placed within the cavity of the second mold portion. A second side of the backplate is in contact with an inner surface of the second mold portion and a second side of the die is in thermal contact with the heatsink and the support pedestals are in contact with the first side of the substrate. The first side of the IC die is opposite the second side of the IC die. The first and second mold portions are joined and the mold pins contact a second surface of the substrate. The second side of the substrate is opposite the first side of the substrate. Finally, the mold cavity is filled with an overmold material to provide an overmolded electronic assembly that includes the substrate, the backplate and the overmold material.

According to another aspect of the invention, the substrate is a printed circuit board (PCB). According to a different aspect of the present invention, the substrate includes an electrical connector that provides electrical interconnection to an external device. The mold pins may be spring biased and the IC die may be a flip-chip. The mold pins and the support pedestals may be arranged opposite one another to reduce mold induced flexure of the substrate. The second side of the substrate may include a plurality of resilient pads arranged to contact an end of the mold pins, when the first and second mold portions are joined. In this embodiment, a solder mask may be utilized to provide the resilient pads. A thermal film may also be positioned between the second side of the IC die and the heatsink.

According to a different embodiment of the present invention, a technique for manufacturing an electronic assembly includes a number of steps. A mold having a first mold portion and a second mold portion is provided. The first and second mold portions each include a cavity that provides a mold cavity, when joined. A backplate is provided that includes a plurality of support pedestals and an integrated heatsink extending from a first side of the backplate. The support pedestals each include an upper compliant portion. A substrate includes a first side of an integrated circuit (IC) die mounted to a first side of the substrate. The IC die is electrically connected to one or more of a plurality of electrically conductive traces formed on the first side of the substrate. The substrate includes a plurality of holes arranged to receive the upper compliant portion of the support pedestals. The backplate and substrate are placed within the cavity of the second mold portion, with a second side of the backplate in contact with an inner surface of the second mold portion. A second side of the die is in thermal contact with the heatsink and the upper compliant portion of the support pedestals are each received in a different one of the holes in the substrate to interconnect the substrate to the heatsink. The first side of the IC die is opposite the second side of the IC die and the first side of the substrate is opposite the second side of the substrate. The first and second mold portions are joined and the mold cavity is filled with an overmold material, to provide an overmolded electronic assembly that includes the substrate, the backplate and the overmold material.

The substrate may be a printed circuit board (PCB) and may include an electrical connector that provides electrical interconnection to an external device. In one embodiment of the present invention, the holes in the substrate are plated with an electrically conductive material and the upper compliant portion of the support pedestals are interference fit to electrically ground the backplate to a ground plane of the substrate. The IC die may be a flip-chip and a thermal film may be positioned between the second side of the IC die and the heatsink.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
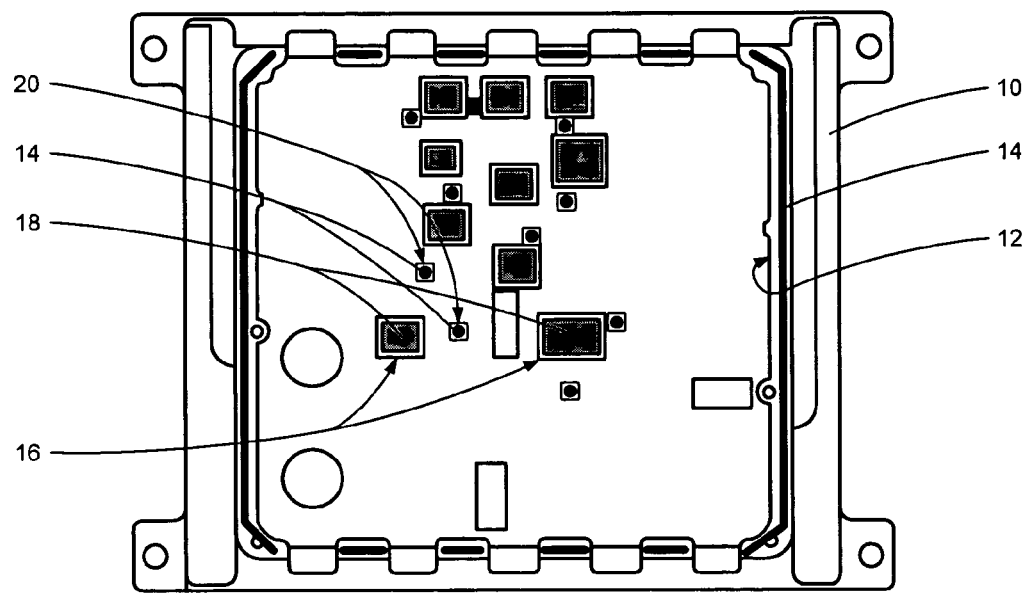
FIG. 1 is a top view of an exemplary prior art backplate, including structural and thermally conductive adhesives applied thereto.

According to one embodiment of the present invention, mold pins, located in a mold tool secure a substrate, e.g., a populated printed circuit board (PCB), against a backplate during an overmolding process. In one embodiment of the present invention, the pins are spring-loaded to provide a specified force to the top side of the PCB. Support pedestals of the backplate are positioned on the backside of the substrate, directly opposite the pins, to prevent PCB flexure. A solder mask may be located on the top and bottom surfaces of the PCB to act as a cushion for the pins and the support pedestals. Furthermore, when fine pitch devices, such as flip-chips, are implemented as the integrated circuit (IC) die, a series of epoxy support dots may be utilized to ensure solder bump collapse does not create electrical shorts between solder It should be appreciated that a structural adhesive is not required to attach the PCB to the backplate, as the mold pins and the support pedestals act to secure the PCB within the mold. Furthermore, the use of a thermal adhesive between a heatsink pedestal of the backplate and an IC die is not required, as the IC die is closely located to a surface of the heatsink pedestal. As such, a mold compound that is utilized to overmold the electronic assembly fills any gap between the flip-chip and the heatsink pedestal to provide an adequate thermal path. It should be appreciated that if a higher performance thermal path is desired, between the IC die and the heatsink, a thermal pad can be located on a back surface of the die. Additionally, the thermal pad, when implemented, may also take up any tolerance slack in the assembly. The thermal pad may be, for example, a graphite-filled thermal film, which typically provides excellent thermal properties for high-power devices with minimal impact on the manufacturing process.

According to another embodiment of the present invention, a PCB may be attached to a backplate with compliant pins. In this embodiment, the pins may be inserted in portions of the backplate or may be an integral feature of the backplate, e.g., cast into the backplate. In either case, the pins are inserted through holes in the PCB, which may be plated holes. In this case, the pins may be interference fit to the plated holes to electrically connect the backplate to a ground plane of the PCB for better electromagnetic interference (EMI) performance. It should be appreciated that the PCB can be joined to the backplate, prior to the molding process (using a press), or may be secured to the backplate during a clamping cycle, implemented during the molding process.

It should be appreciated that the above-described process removes steps from the manufacturing process used to manufacture a prior art electronic assembly. That is, the thermal and structural adhesive dispense steps and the adhesive cure step can be eliminated. This saves both materials and time. Furthermore, the new process effectively decouples IC dies from the backplate, during the molding process. This generally increases the robustness of the manufacturing process, as the process does not rely on a structural adhesive to prevent excessive flexure of the PCB. That is, during the prior art process, if the structural adhesive fails, the stress of the mold compound on the PCB is absorbed by the solder bumps of the flip-chip, which may, as a result of the increased stress, fail.

Figure 2:
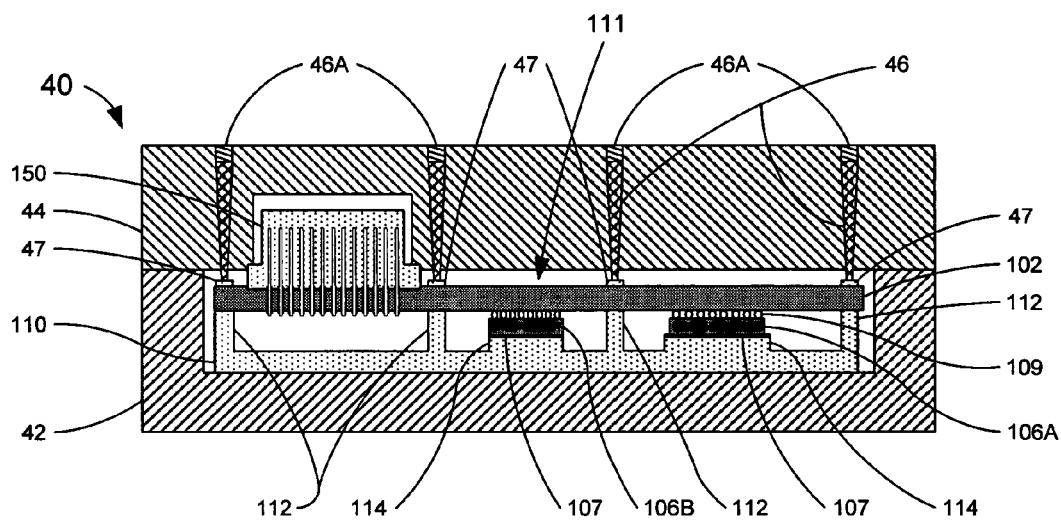
FIG. 2 is a cross-sectional view of an electronic assembly positioned within a mold, constructed according to one embodiment of the present invention.

With reference to FIG. 2, a cross-sectional view of an electronic assembly 100, prior to overmolding, located within a mold 40 is depicted. As is shown, the mold 40 includes a first mold portion 44 and a second mold portion 42. As is shown in FIG. 2, the electronic assembly 100 includes a backplate 110 and a substrate 102. Attached to the substrate 102 are a plurality of integrated circuit (IC) dies 106A and 106B. The dies 106A and 106B are electrically connected to traces formed on a first surface of the substrate 102, via solder bumps 109. The backplate 110 includes a plurality of support pedestals 112, which are positioned to support the substrate 102, during the overmolding process. The backplate 110 also includes a plurality of integral heatsinks 114, which are utilized to remove heat from the dies 106A and 106B. As is shown in FIG. 2, a thermal film 107 may be positioned between a surface of the heatsinks 114 and the dies 106A and 106B. A connector 150 also extends from a second surface of the substrate 102. As is shown, the first mold portion 44 closes on a portion of the connector 150 to prevent leakage of the overmold material to be injected into cavity 111.

Figure 3:
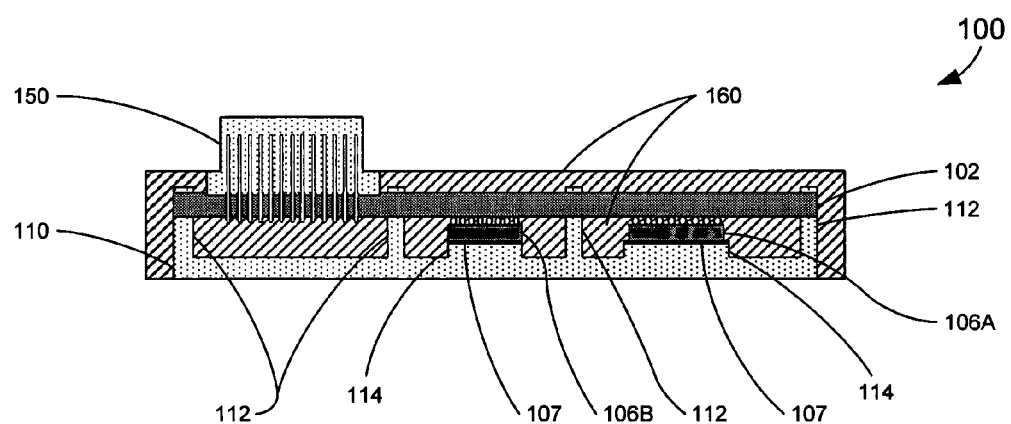
FIG. 3 is a cross-sectional view of the electronic assembly of FIG. 2, after overmolding and removal from the mold.

The first mold portion 44 includes a plurality of spaced mold pins 46, which are each individually biased by a spring 46A. An end of the mold pins 46 may rest on resilient support pads 47, which may be, for example, a portion of a solder mask. As is shown, the pins 46 are aligned with the support pedestals 112 of the backplate 110. Thus, during the overmolding process, the pins 46 and the support pedestals 112 (of the backplate 110) support the substrate 102 to prevent excessive flexure of the substrate 102 and damage to the solder bumps 109 that couple the flip-chips 106A and 106B to conductive traces formed on the first surface of the substrate 102. FIG. 3 depicts the electronic assembly 100, after the overmolding process has been completed and the assembly 100 has been removed from the mold 40. As is shown, an overmold material 160 underfills a lower portion of the substrate 102 and environmentally seals the substrate 102.

Figure 4:
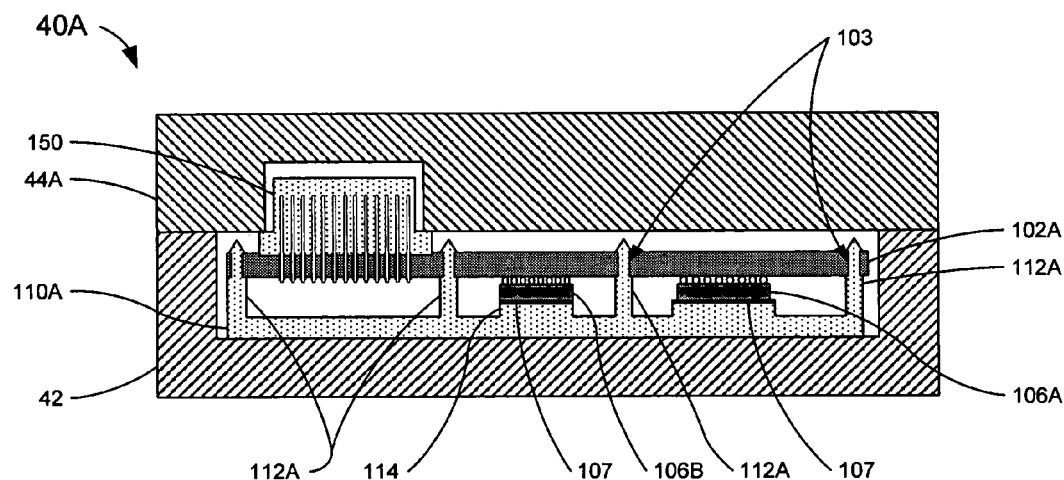
FIG. 4 is a cross-sectional view of an electronic assembly located within a mold, constructed according to another embodiment of the present invention.
Figure 5:
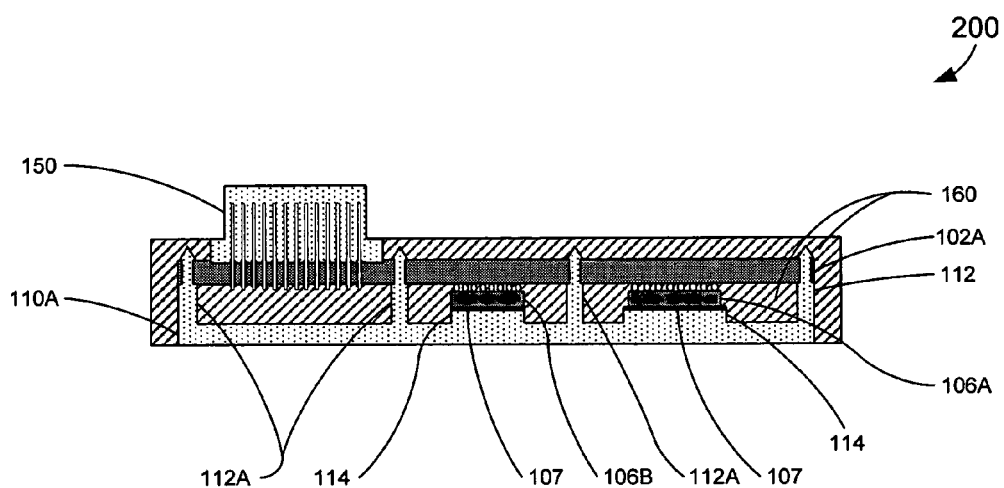
FIG. 5 is a cross-sectional view of the electronic assembly of FIG. 4, after overmolding and removal from the mold.

With reference to FIG. 4, a mold 40A includes an upper mold portion 44A and a lower mold portion 42, designed according to another embodiment of the present invention. Similar to the mold 40 of FIG. 2, the mold 40A closes on a portion of the connector 150 of the electronic assembly 200. As is shown, a backplate 110A includes a plurality of support pedestals 112A, each with an upper compliant portion that is designed to be received in one of a plurality of holes 103, formed in the substrate 102A. FIG. 5 depicts the electronic assembly 200, after the overmolding process has been completed and the assembly 200 has been removed from the mold 40A.

Figure 6:
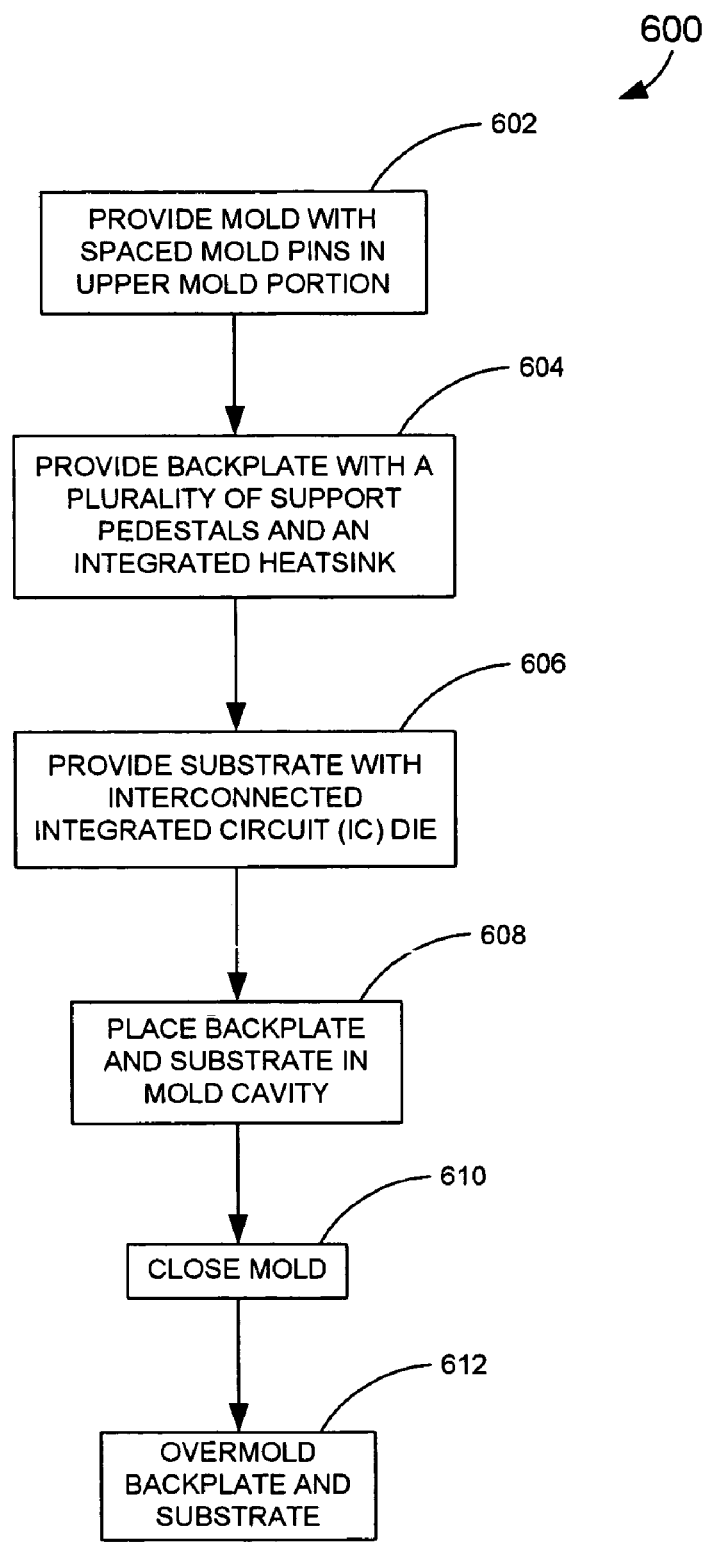
FIG. 6 is an exemplary process flow chart for constructing an overmolded electronic assembly, according to FIG. 3.

As is shown in FIG. 6, a process 600 for manufacturing the electronic assembly 100 includes a number of steps. Initially, in step 602, a mold 40 is provided. As is discussed above, the mold 40 may be a two-piece mold that includes the first mold portion 44 and the second mold portion 42. The first and second mold portions 44 and 42 each include a cavity and together form a mold cavity 111. The first mold 44 includes a plurality of spaced mold pins 46 extending from an inner surface. Next, in step 604, a backplate is provided that includes a plurality of support pedestals 112 and integrated heatsinks 114. Then, in step 606, a substrate 102 is provided that includes a plurality of interconnected integrated circuit (IC) dies 106A and 106B. The dies 106A and 106B are mounted to a first side of the substrate 102 and are electrically connected to one or more of a plurality of electrically conductive traces formed on a first side of the substrate 102.

Next, in step 608, the backplate 110 and the substrate 102 are placed in the second mold portion 42. A second side of the backplate 110 is in contact with an inner surface of the second mold portion 42 and a second side of the dies 106A and 106B are in thermal contact with the integrated heatsinks 114. The support pedestals 112 are also in contact with the first side of the substrate 102. Then, in step 610, the mold 40 is closed, i.e., the first and second mold portions 44 and 42 are joined. As such, the mold pins 46 contact a second surface of the substrate 102 and, according to one embodiment of the present invention, are arranged to be opposite the support pedestals 112. Then, in step 610, the backplate 110 and the substrate 102 are overmolded by filling the mold cavity with an overmold material 160.

As is discussed above, the substrate 102 may be any number of different types of substrates, such as a printed circuit board (PCB). According to one embodiment of the present invention, the mold pins 46 are biased by spring 46A. According to another embodiment of the present invention, the second side of the substrate 102 includes a plurality of resilient pads 47 arranged to contact an end of the mold pins 46, when the first and second mold portions 44 and 42 are joined. A thermal film 107 may also be positioned between the second side of the IC dies 106A and 106B and the heatsinks 114.

Figure 7:
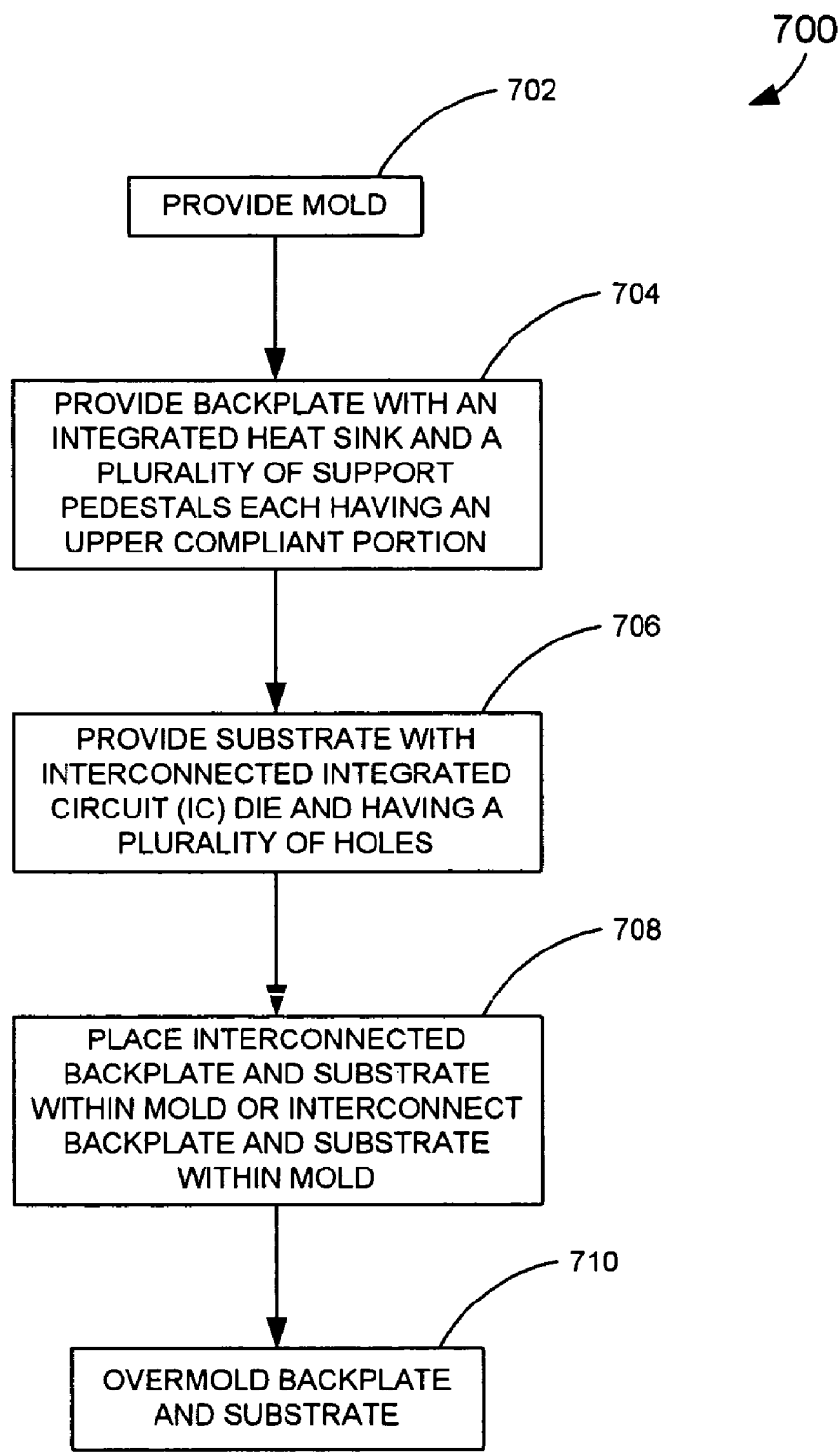
FIG. 7 is an exemplary process flow chart for constructing an overmolded electronic assembly, according to FIG. 5.

According to another embodiment of the present invention, a process 700 is utilized for manufacturing the electronic assembly 200. According to the process 700, as is shown in FIG. 7, the mold 40A is provided in step 702. The mold 40A includes a first mold portion 44A and a second mold portion 42, which each include a cavity, which, when joined, provide a mold cavity 111. Next, in step 704, a backplate 110A is provided with integrated heatsinks 114 and a plurality of support pedestals 112A, each having an upper compliant portion. Next, in step 706, the substrate 102A is provided with a plurality of integrated circuit (IC) dies 106A and 106B. The substrate 102A also includes a plurality of holes 103, which are designed to receive the upper compliant portion of each of the support pedestals 112A. Then, in step 708, the interconnected backplate 110A and substrate 102A are placed within the mold 40A. Alternatively, the backplate 110A and the substrate 102A may be interconnected, after being placed within the mold cavity by the closing of the mold 40A. In one embodiment of the present invention, the holes 103 in the substrate 102A are plated with an electrically conductive material and the upper compliant portion of the support pedestals 112A are interference fit in the holes 103 to electrically ground the backplate 110A to a ground plane of the substrate 102A. Finally, in step 710, the backplate 110A and the substrate 102A are overmolded to produce the overmolded electronic assembly 200, as is shown in FIG. 5.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for manufacturing an electronic assembly, comprising the steps of:
   providing a mold having a first mold portion and a second mold portion, wherein the first and second mold portions each include a cavity, and wherein the first mold portion includes a plurality of spaced mold pins extending from an inner surface, where the cavity of the first and second mold portions provides a mold cavity when joined;
   providing a backplate, the backplate having a plurality of support pedestals and an integrated heatsink extending from a first side of the backplate;
   providing a substrate with a first side of an integrated circuit (IC) die mounted to a first side of the substrate, wherein the IC die is electrically connected to one or more of a plurality of electrically conductive traces formed on the first side of the substrate;
   placing the backplate and the substrate within the cavity of the second mold portion, wherein a second side of the backplate is in contact with an inner surface of the second mold portion, and wherein a second side of the die is in thermal contact with the heatsink and the support pedestals are in contact with the first side of the substrate, where the first side of the IC die is opposite the second side of the IC die;
   joining the first and second mold portions, wherein the mold pins contact a second side of the substrate, and wherein the second side of the substrate is opposite the first side of the substrate; and
   filling the mold cavity with an overmold material to provide an overmolded electronic assembly that includes the substrate, the backplate and the overmold material.

2. The method of claim 1, wherein the substrate is a printed circuit board (PCB).

3. The method of claim 1, wherein the substrate includes an electrical connector that provides electrical interconnection to an external device.

4. The method of claim 1, wherein the mold pins are spring biased.

5. The method of claim 1, wherein the IC die is a flip-chip.

6. The method of claim 1, wherein the mold pins and the support pedestals are arranged opposite one another to reduce mold induced flexure of the substrate.

7. The method of claim 1, wherein the second side of the substrate includes a plurality of resilient pads arranged to contact an end of the mold pins when the first and second mold portions are joined.

8. The method of claim 7, wherein a solder mask provides the resilient pads.

9. The method of claim 1, wherein a thermal film is positioned between the second side of the IC die and the heatsink.

10. A method for manufacturing an electronic assembly, comprising the steps of:
- providing a mold having a first mold portion and a second mold portion, wherein the first and second mold portions each include a cavity, and wherein the cavity of the first and second mold portions provides a mold cavity when joined;
- providing a backplate, the backplate having a plurality of support pedestals and an integrated heatsink extending from a first side of the backplate, wherein the support pedestals each include an upper compliant portion;
- providing a substrate with a first side of an integrated circuit (IC) die mounted to a first side of the substrate, wherein the IC die is electrically connected to one or more of a plurality of electrically conductive traces formed on the first side of the substrate, and wherein the substrate includes a plurality of holes arranged to receive the upper compliant portion of the support pedestals;
- placing the backplate and the substrate within the cavity of the second mold portion, wherein a second side of the backplate is in contact with an inner surface of the second mold portion, and wherein a second side of the IC die is in thermal contact with the heatsink and the upper compliant portion of the support pedestals are each received in a different one of the holes in the substrate to interconnect the substrate to the heatsink, where the first side of the IC die is opposite the second side of the IC die;
- joining the first and second mold portions, wherein the second side of the substrate is opposite the first side of the substrate; and
- filling the mold cavity with an overmold material to provide an overmolded electronic assembly that includes the substrate, the backplate and the overmold material.

11. The method of claim 10, wherein the substrate is a printed circuit board (PCB).

12. The method of claim 10, wherein the substrate includes an electrical connector that provides electrical interconnection to an external device.

13. The method of claim 10, wherein the holes in the substrate are plated with an electrically conductive material and the upper compliant portion of the support pedestals are interference fit to electrically ground the backplate to a ground plane of the substrate.

14. The method of claim 10, wherein the IC die is a flip-chip.

15. The method of claim 10, wherein a thermal film is positioned between the second side of the IC die and the heatsink.

16. An electronic assembly, comprising:
- a backplate having a plurality of support pedestals and an integrated heatsink extending from a first side of the backplate, wherein the support pedestals each include an upper compliant portion;
- a substrate with a first side of an integrated circuit (IC) die mounted to a first side of the substrate, wherein the IC die is electrically connected to one or more of a plurality of electrically conductive traces formed on the first side of the substrate, and wherein the substrate includes a plurality of holes arranged to receive the upper compliant portion of the support pedestals, where a second side of the IC die is in thermal contact with the heatsink and the upper compliant portion of the support pedestals are each received in a different one of the holes in the substrate to interconnect the substrate to the heatsink, where the first side of the IC die is opposite the second side of the IC die; and
- an overmold material encompassing the substrate and at least a portion of the backplate.

17. The assembly of claim 16, wherein the substrate is a printed circuit board (PCB).

18. The assembly of claim 16, wherein the substrate includes an electrical connector that provides electrical interconnection to an external device.

19. The assembly of claim 16, wherein the holes in the substrate are plated with an electrically conductive material and the upper compliant portion of the support pedestals are interference fit to electrically ground the backplate to a ground plane of the substrate.

20. The assembly of claim 16, wherein the IC die is a flip-chip, and wherein a thermal film is positioned between the second side of the IC die and the heatsink.

* * * * *